(12) United States Patent
Seebeck et al.

(10) Patent No.: US 8,165,845 B1
(45) Date of Patent: Apr. 24, 2012

(54) METHOD AND APPARATUS FOR STATISTICAL IDENTIFICATION OF DEVICES BASED ON PARAMETRIC DATA

(75) Inventors: Katherine Seebeck, Berthoud, CO (US); Andrew Flynn, Calverstown (IE)

(73) Assignee: Xilinx, Inc., San Jose, CA (US)

( * ) Notice: Subject to any disclaimer, the term of this patent is extended or adjusted under 35 U.S.C. 154(b) by 1055 days.

(21) Appl. No.: 12/098,377

(22) Filed: Apr. 4, 2008

(51) Int. Cl.
*G06F 17/18* (2006.01)

(52) U.S. Cl. ...................................................... 702/179

(58) Field of Classification Search .................. 702/179
See application file for complete search history.

(56) References Cited

U.S. PATENT DOCUMENTS

| | | | |
|---|---|---|---|
| 6,330,526 B1* | 12/2001 | Yasuda | 703/2 |
| 2004/0267477 A1* | 12/2004 | Scott et al. | 702/108 |
| 2005/0278597 A1* | 12/2005 | Miguelanez et al. | 714/738 |
| 2008/0262793 A1* | 10/2008 | Subramaniam et al. | 702/179 |

OTHER PUBLICATIONS

Seebeck, Katherine, "Using JMP for Maverick control Implementation", JMP 2007 Conference, Jun. 2007, pp. 1-6, Xilinx, Inc. 2100 Logic Drive, San Jose, CA 95124.
Flynn, A., et al., "Implementation of 2 Dimensional Maverick Control Limits and their Ability to Screen Die with Defect Induced Leakage", 5 pages, 2008 IEEE International Reliability Physics Symposium, Apr. 2008. Xilinx, Inc. 2100 Logic Drive, San Jose, CA 95124.
U.S. Appl. No. 10/990,045, filed Nov. 16, 2004, Dalvi, Ajay, Xilinx, Inc. 2100 Logic Drive, San Jose, CA 95124.

* cited by examiner

*Primary Examiner* — Cindy H Khuu
(74) *Attorney, Agent, or Firm* — Michael T. Wallace; LeRoy D. Maunu (57) ABSTRACT

A method and apparatus is provided for the calculation of maverick control limits. The maverick control limit method selects the correct parameter(s) as critical parameters to be utilized by the maverick control limit method. Next, the maverick control limit method identifies the probability density function that is associated with the parametric data set(s) that are associated with the critical parameter(s). Next, abnormal data points within the measured parametric data set(s) are removed. Maverick control limits are then calculated to properly disposition semiconductor die into pass/fail categories.

20 Claims, 6 Drawing Sheets

METHOD AND APPARATUS FOR STATISTICAL IDENTIFICATION OF DEVICES BASED ON PARAMETRIC DATA

FIELD OF THE INVENTION

The present invention generally relates to statistical methods and processes, and more particularly to statistical methods and processes that identify devices having unacceptable performance deviations.

BACKGROUND OF THE INVENTION

Advances in the field of semiconductor integrated circuits have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometers (nm).

Continuing efforts to achieve higher levels of integration have also led to reductions in the separation distance between adjacent semiconductor features. For example, nanometer processes producing 65 nm and 45 nm gate lengths require a device spacing of, e.g., 120 nm, to achieve reasonable yields within specified process margins. As a result, the number of features that exist on any given semiconductor die is increasing drastically. Obtaining 100% test coverage for each semiconductor feature that exists on each semiconductor die, therefore, is becoming increasingly difficult.

In order to alleviate the amount of test coverage required for any given semiconductor die, statistical methods may be employed to screen the semiconductor die based upon behavior that is statistically deduced from certain parametric data measurements taken on the semiconductor die. One such statistical method implements the so-called "maverick control" methodology to characterize performance of semiconductor devices at wafer sort and/or final test without the need to conduct comprehensive testing on each semiconductor feature. In particular, maverick control limits are utilized to statistically identify those units exhibiting abnormal behavior based on certain parametric data obtained from semiconductor die under test.

Conventional maverick control implementations, however, assume that the probability density function of the critical parametric data relating to any given semiconductor die under test exhibits a normal, or Gaussian, density. Accordingly, semiconductor devices having associated parametric data that lie outside the boundaries of an acceptable normal density, e.g., statistical mean+/−6 standard deviations (6-sigma), may be deemed to be unacceptable.

However, if the probability density function of the critical parametric data relating to any given semiconductor die does not conform to a normal density function, then significant errors are introduced into the statistical method that is used to characterize the semiconductor die under test. As such, yield may be needlessly sacrificed due to a malfunctioning statistical method that incorrectly disposes of semiconductor die that might otherwise be held to be satisfactory and/or fails to identify high-risk die that are ultimately shipped as acceptable units. Furthermore, large amounts of computational resources may be needlessly expended when attempting to adjust the parameters of the malfunctioning statistical method to enhance performance.

Conventional maverick control limit implementations also neglect valuable statistical information that may be ascertained due to their failure to consider the amount of correlation information that may exist between two or more parametric variables. As such, the inability to screen semiconductor die based upon the unknown correlation information further degrades the performance of conventional maverick control limit implementations.

Efforts continue, therefore, to provide a maverick control limit implementation that more accurately reflects the probability density function exhibited by the critical parametric data. Further, efforts continue to develop a maverick control limit implementation that accounts for two highly correlated parametric data variables.

SUMMARY OF THE INVENTION

To overcome limitations in the prior art, and to overcome other limitations that will become apparent upon reading and understanding the present specification, various embodiments of the present invention disclose a method and apparatus for an enhanced maverick control limit method.

In accordance with one embodiment of the invention, a method of calculating maverick control limits includes selecting at least one critical parameter, importing at least one parametric data set associated with the at least one critical parameter into a density identification block of a maverick control platform, identifying a probability density function exhibited by the at least one parametric data set, removing outlier data from the at least one parametric data set, determining maverick control limits for the at least one parametric data set, and generating a disposition determination in response to the maverick control limits determined for the at least one parametric data set.

In accordance with another embodiment of the invention, a maverick control limit processing system includes a processor that is adapted to generate maverick control limits for one or more parametric data sets. The processor may be further adapted to perform functions including, selecting one or more critical parameters, importing one or more parametric data sets associated with the one or more critical parameters into a density identification block of the maverick control limit processing system, identifying a probability density function exhibited by the one or more parametric data sets, removing outlier data from the one or more parametric data sets, determining maverick control limits for the one or more parametric data sets, and generating a disposition determination in response to the maverick control limits determined for the one or more parametric data sets.

In accordance with another embodiment of the invention, a method of calculating maverick control limits includes selecting two critical parameters, importing two parametric data sets associated with the two critical parameters into a density identification block of a maverick control platform, partitioning one of the parametric data sets into a plurality of data segments, identifying a data set for each of the plurality of data segments, identifying a probability density function exhibited by each identified data set, removing outlier data from each identified data set, determining maverick control limits for each identified data set, fitting an equation that corresponds to each identified data set of the plurality of data segments, and generating a disposition determination in response to the fitted equation.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to a maverick control limit method executed within a computational architecture that is utilized to identify devices under test whose performance is statistically different from the performance of other devices under test regardless of the performance specifications. In one embodiment, for example, devices under test may include semiconductor die having many millions of microcircuits implemented thereon. As such, one or more electrical parameters, such as voltage out high ($V_{OH}$), voltage out low ($V_{OL}$), duty cycle, rise time, fall time, power supply current drain, contact resistance, power/ground plane resistance, etc., may be selected as critical parameters that are to be exploited by the maverick control limit method to determine whether a particular semiconductor die falls within an acceptable probability density function based upon its individual parametric data measurements. In other examples, the methods and techniques described can be to identify devices using other types of circuits having corresponding parameters. For instance, although described herein with respect to semiconductor die, the present invention may be useful with other circuits such as optical, quantum, nano-technology, or biological circuits and technologies.

Thus, the first step of the maverick control limit method in accordance with the present invention is to select the "correct" parameters as the critical parameters to be utilized by the maverick control limit method. In the determination as to which of the parameters are to be selected as critical, an identification of high risk parameters should be employed which takes into consideration such criteria as: 1) severity of failure to the end customer of the semiconductor die; 2) occurrence of the failure and/or the root cause of the failure; and 3) the ability to detect the failure after occurrence. Those high risk parameters having been categorized with higher priority in view of such criteria are then ideal candidates for the maverick control limit method.

The second step of the maverick control limit method is to operate on a sample set of parametric data that is sufficiently sized so as to yield statistically accurate results. For example, a sufficiently large parametric data set containing such critical parameters as, e.g., rise time, fall time, and power supply current drain, should be taken on enough semiconductor die that have been manufactured over a given time period, so that the overall process variability may be adequately captured.

The third step of the maverick control limit method is to properly identify the best probability density function that is associated with the parametric data taken during the second step. For example, rise time measurements taken across a batch of semiconductor die may exhibit a lognormal density function, rather than a normal, or Gaussian, density function. Accordingly, properly identifying the probability density function that is exhibited by the parametric data set significantly enhances the performance and accuracy of the maverick control limit method. For example, an enhancement is realized by reducing the number of semiconductor die that are incorrectly rejected due to an inaccurate representation of the density function that is actually exhibited by the parametric data set of the second step.

The fourth step of the maverick control limit method seeks to remove those sample points within the measured parametric data set that are statistically different from the other measured parametric data. Removal of the so-called "outliers" reduces the tendency to skew the statistical mean and standard deviation of the probability density function identified in the third step. The fifth and sixth steps involve the calculation of the maverick control limits and subsequent disposition limits, respectively, that are utilized to ultimately categorize each semiconductor die into a pass/fail status.

The six steps of the maverick control limit method are useful to identify 1-dimensional aspects of semiconductor devices that do not behave in accordance with statistical norms. As such, failure modes that are difficult to identify at wafer sort and/or final test may be preempted by applying the maverick control limits on certain electrical parameters that may be the root causes of those failure modes, e.g., metal contact resistance of vias or the distributed impedance of a power/ground plane. For example, the maverick control limit method may identify certain semiconductor die that do not exhibit a metal contact resistance magnitude that conforms to a statistically normal device. As such, those abnormal semiconductor die may be identified as failed devices and discarded before they become a source of failure later in production or operation in the field.

The volume of parametric data taken on any given semiconductor die is generally significant and usually involves many different parameters that may be deemed to be critical as discussed above. The relative correlation between any two of these critical parameters often provides additional valuable information concerning the prognosis of future viability of the semiconductor die.

For example, semiconductor devices designed for high-speed applications often require an increased amount of power supply current to operate. As such, a high-speed device that exhibits relatively fast rise and fall times that also draws a correspondingly high amount of power supply current may be identified by the maverick control limit method as a statistically normal device. On the other hand, a high-speed device that exhibits relatively slow rise and fall times, but still draws a high amount of power supply current may be identified by the maverick control limit method as a statistically abnormal device that is to be disposed of accordingly. As discussed in more detail below, therefore, a 2-dimensional maverick control implementation is utilized to identify an abnormally behaving semiconductor device by making use of the correlation information provided by two of the critical parameters selected, e.g., rise-time/fall-time and power supply current drain.

Figure 1:
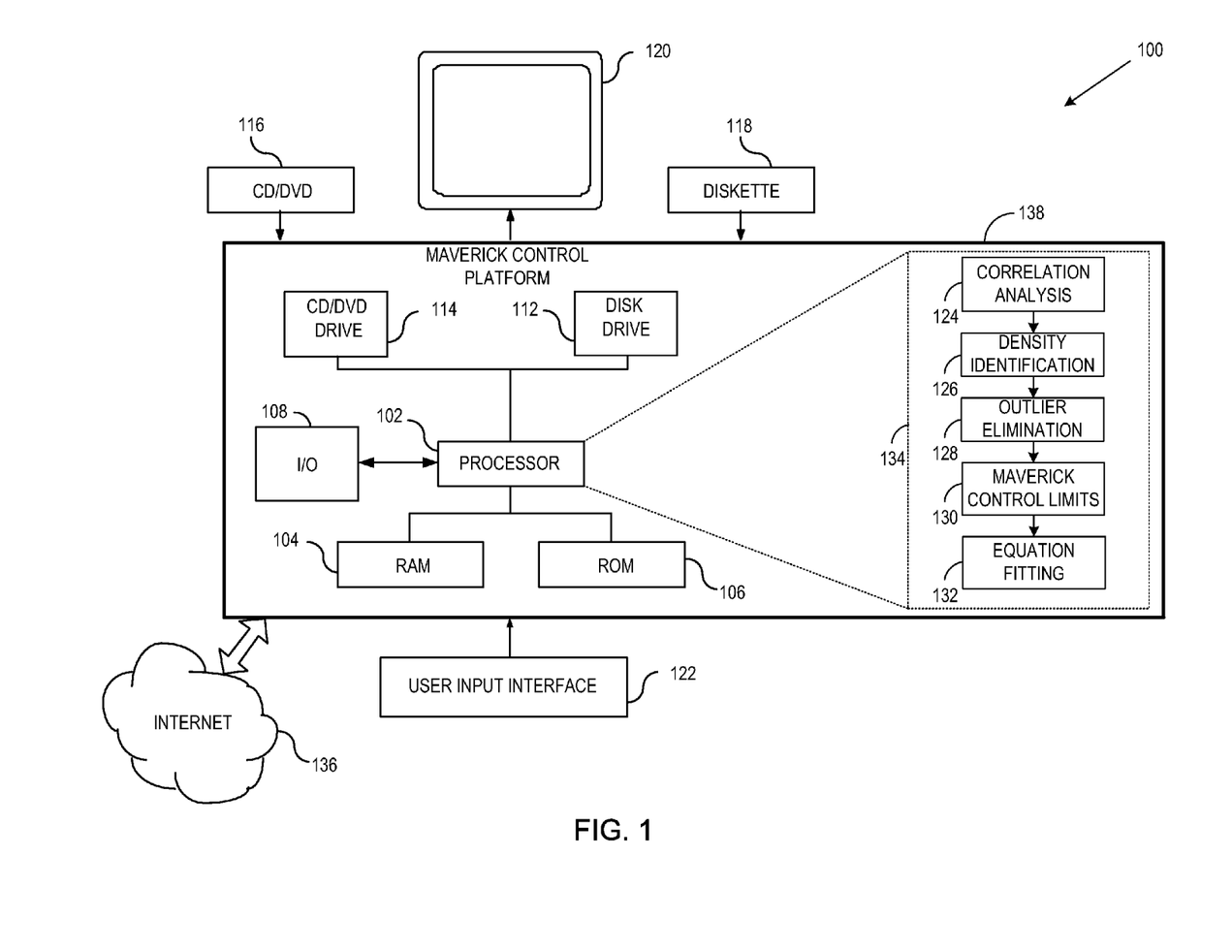
FIG. 1 illustrates an exemplary maverick control limit workstation.

Turning to FIG. 1, a maverick control platform is illustrated, which may be used to calculate either 1-dimensional or 2-dimensional maverick control limits in accordance with one embodiment of the present invention. Maverick control platform 138 includes a central processor (CPU) 102 that is coupled to random access memory (RAM) 104 and read-only memory (ROM) 106. The ROM 106 may also include other types of storage media, such as programmable ROM (PROM), electronically erasable PROM (EEPROM), etc., to store executable programs and utilities. The processor 102 may also communicate with other internal and external components through input/output (I/O) circuitry 108.

Maverick control platform 138 may also include one or more data storage devices, including hard and floppy disk drives 112, CD/DVD drives 114, and other hardware capable of reading and/or storing information. Software for facilitating the maverick control limit calculations may be stored and distributed on a CD/DVD 116, diskette 118 or other form of media capable of portably storing information. These storage media may be inserted into, and read by, devices such as CD/DVD drive 114, disk drive 112, etc. The software for facilitating the maverick control limit calculations may also be transmitted to maverick control platform 138 via data signals that are downloaded electronically via a network, such as Internet 136, or other wired or wireless communications.

Maverick control platform 138 is coupled to a display 120, which may be any type of known display or presentation screen, such as LCD displays, plasma display, cathode ray tubes (CRT), etc. A user input interface 122 is provided, which includes one or more user interface mechanisms such as a mouse, keyboard, microphone, touch pad, touch screen, voice-recognition system, etc.

Processor 102 may be adapted to iteratively execute maverick control limit calculation tools 134 to aid in maverick control limit operations. Correlation analysis block 124, for example, may be executed by processor 102 to define the critical data parameters that are to be used during the maverick control limit operations. Density identification block 126 receives the parametric data that corresponds to the critical data parameters as defined by correlation analysis block 124 and identifies the probability density function that is exhibited by the parametric data set.

Parametric data values found to exist outside of the probability density function, as identified by density identification block 126, are then iteratively removed by outlier elimination block 128 so as to remove skew of the statistical mean and inflation of the standard deviation that is caused by the outliers. Once outliers are removed, maverick control limits may then be calculated in block 130 and subsequently used for proper disposition of the device under test. If a 2-dimensional maverick control limit implementation is desired, then a bivariate set of maverick control limits are calculated in block 130 and then fitted to an $n^{th}$ degree polynomial equation in equation fitting block 132 to define the correlation curve that exists between each parametric data point of the parametric data pair as defined in block 124.

One function provided by correlation analysis block 124 is to allow selection of the correct critical parameters. For example, correlation analysis block 124 may implement a failure mode and effect analysis (FMEA) to identify high risk parameters based upon a rating system. The rating system allows the ranking of data parameters in order of decreasing risk based on independent criteria, such as: 1) severity of the failure mode; 2) occurrence of the failure mode and its root cause; and 3) ability to detect the failure mode once it occurs.

Once the initial collection of potential critical parameters is selected, correlation analysis block 124 then allows the selection of the fewest number of critical parameters while maximizing the amount of critical information that may be obtained from them. The number of critical parameters may be reduced, for example, by analyzing the coefficient of determination, or the coefficient of correlation, between each parameter pair. If the coefficient of determination, $R^2$, between a parameter pair exceeds or equals 0.75, or the coefficient of correlation, R, between a parameter pair exceeds or equals 0.87, then a sufficient degree of correlation exists between the two parameters, such that one parameter of the parameter pair may be discarded due to redundancy. Other examples may have other thresholds for determining a sufficient degree of correlation.

TABLE 1

|  | Parameter 1 | Parameter 2 | Parameter 3 | Parameter 4 |
| --- | --- | --- | --- | --- |
| Parameter 1 | 1.0000 | 0.8919 | 0.0241 | −0.0058 |
| Parameter 2 | 0.8919 | 1.0000 | 0.0146 | 0.0840 |
| Parameter 3 | 0.0241 | 0.0146 | 1.0000 | 0.9176 |
| Parameter 4 | −0.0058 | 0.0840 | 0.9176 | 1.0000 |

Turning to Table 1, for example, coefficients of correlation, R, are tabulated in matrix form for parameters 1 through 4. It can be seen that the R value of parameters 1 and 2 is equal to 0.8919 and the R value of parameters 3 and 4 is equal to 0.9176. As such, parameter 1 or parameter 2 and parameter 3 or parameter 4 may be eliminated as critical parameters because their corresponding R value exceeds 0.87.

Once the critical parameters have been selected, correlation analysis block 124 then selects parametric data measurements that are stored within, e.g., disk drive 112, that correspond to the critical parameters selected. In particular, the sample set selected by correlation analysis block 124 should be large enough so as to capture the overall variability of the data measurements over a given time period. For example, if one of the critical parameters selected by correlation analysis block 124 is through-die via resistance, then through-die via resistance measurement values taken across all semiconductor die from a given batch of semiconductor die should be retrieved. In so doing, an adequately sized sample set may be retrieved that is representative of the variance of through-die via resistance values across the entire batch of semiconductor die.

Figure 2A:
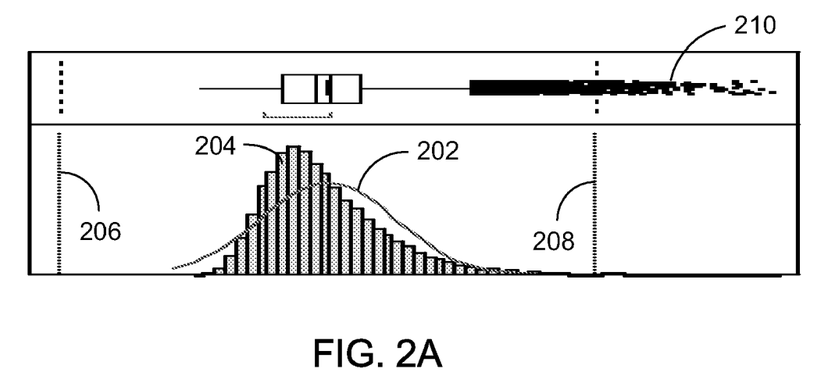
FIG. 2A illustrates a mismatch between an assumed probability density function and an actual probability density function exhibited by a parametric data set.

Probability density identification is then executed by density identification block 126. In particular, the probability density function of the data set that represents the critical parameters selected by correlation analysis block 124 does not always exhibit a normal, or Gaussian, density function. Turning to FIG. 2A, for example, probability density function 202 illustrates a normal probability density function having 4-sigma limits 206 and 208. The actual distribution of parametric data measurement values 204, however, is not Gaussian, but rather exhibits a lognormal density. As can be seen, therefore, if maverick control limits were calculated based upon the presumed normal density function 202, then an unnecessarily large number of data measurements 210 would be discarded, since data measurements 210 exist beyond the equivalent of 4-sigma limit 208.

Figure 2B:
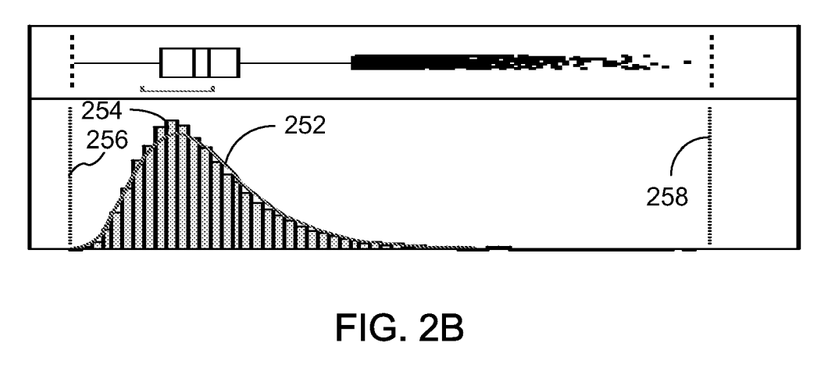
FIG. 2B illustrates an improved probability density function estimate of a parametric data set in accordance with one embodiment of the present invention.

Turning to FIG. 2B, a fitted density function is identified by density identification block 126. In particular, probability density function 252 is fitted to the actual density of parametric data measurement values 254 by density identification block 126, such that fewer data measurements exist outside of 4-sigma limits 256 and 258. Accordingly, fewer data measurements are discarded because fewer data measurements exist beyond the 4-sigma limits. In general, density identification block 126 is utilized to match a probability density function to the type of data parameter measured, whether a particular data parameter set exhibits a normal, lognormal, Rayleigh, or some other probability density function.

Figure 3A:
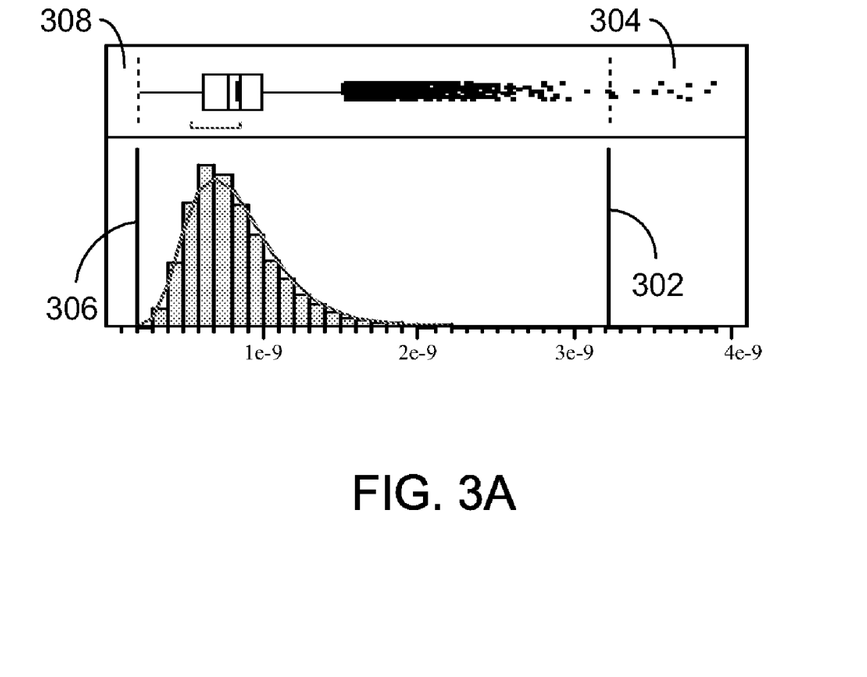
FIGS. 3A-3B illustrate the effects of outlier elimination from the parametric data set of FIG. 2B in accordance with one embodiment of the present invention.

Turning to FIG. 3A, the need for outlier elimination block 128 is graphically illustrated. In particular, even after the proper probability density function is fitted to the measured data set, so called "outliers" may exist beyond acceptable limits. As such, unacceptable skew of the statistical mean and inflation of the standard deviation of the actual density is experienced. In order to eliminate such outliers, standard deviation limit 302 is imposed by outlier elimination block 128, so as to eliminate outliers from area 304. Likewise, standard deviation limit 306 is imposed by outlier elimination block 128, so as to eliminate outliers from area 308. In one embodiment, a percentile equivalent of a 4-sigma standard deviation limit is imposed, such that the probability that a data measurement falls outside 4-sigma limits 304 and 308 is 64 out of 10,000.

That is to say, in other words, that a 4-sigma limit imposes the correct amount of outlier elimination as compared to, e.g., 3-sigma or 5-sigma limits. If the percentile equivalent of 3-sigma limits are imposed, for example, then outlier elimination in large data sets, e.g., greater than 100,000 data values, results in the elimination of standard process values. Conversely, if the percentile equivalent of 5-sigma limits are imposed for small data sets, e.g., less than 370 data values, then too few true outlier values are removed from the data set, which leads to an inaccurate increase in the standard deviation of the data set.

Figure 3B:
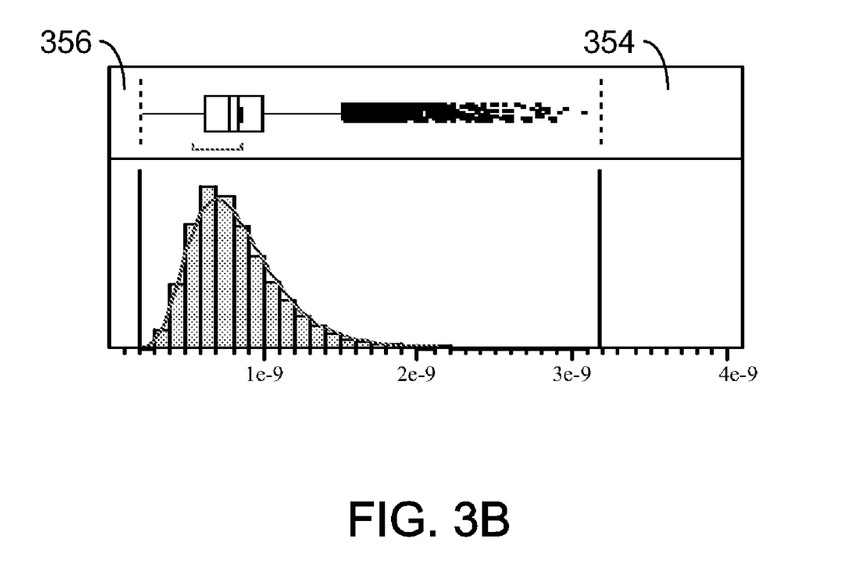

Outlier elimination block 128, therefore, implements an iterative outlier elimination method using 4-sigma limits. First, 4-sigma limits are initially placed on the data set such that the lower percentile is set to 0.000032 and the upper percentile is set to 0.999968. Next, the outliers in the data set that exist beyond the lower and upper percentiles are removed and quantiles are then recalculated on the resulting data set. Outliers are once again removed from the resulting data set and quantiles recalculated. The method is iterated until a convergence is obtained as illustrated in FIG. 3B, whereby all outliers are removed from areas 356 and 354.

Once the outlier elimination method implemented by outlier block 128 converges, maverick control limits may then be established. In particular, the maverick control limits are established at, e.g., 6-sigma from a centerline using the density resulting from outlier elimination block 128 as exemplified in FIG. 4. For the lognormal density exemplified in FIG. 4, for example, the 6-sigma quantile values are found by setting lower percentile limit 402 to $1e^{-9}$ and setting upper percentile limit 404 to 0.999999999. For data sets that exhibit a normal distribution, on the other hand, the maverick control limits may be found by setting the centerline value equal to the mean of the distribution and calculating the 6-sigma points from the mean value.

Figure 4:
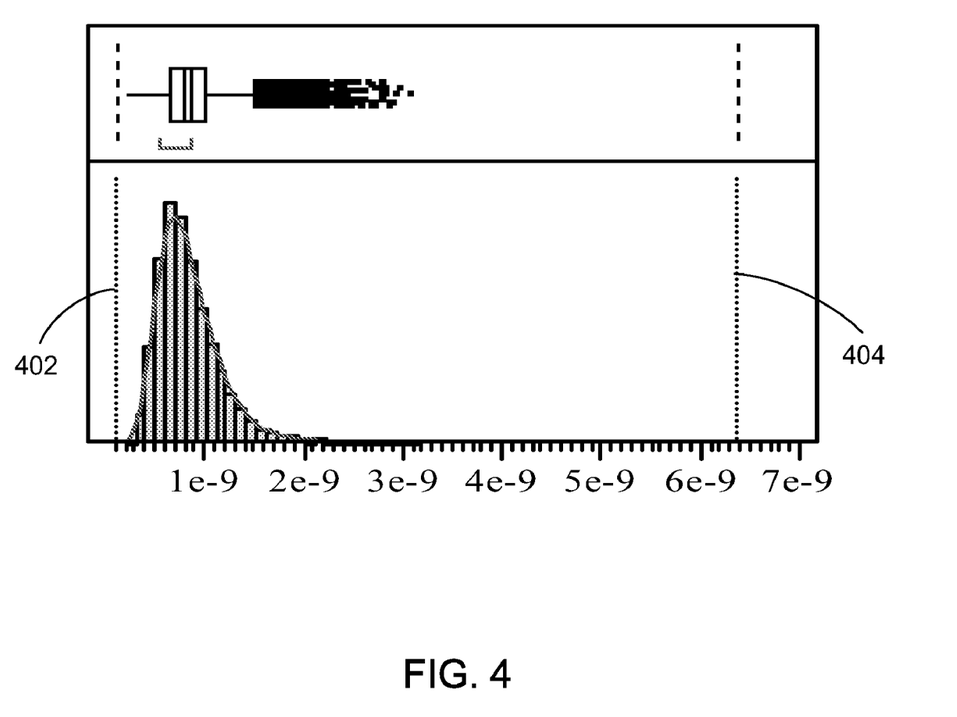
FIG. 4 illustrates established maverick control limits for a 1-dimensional parametric data set.

Data values measured on semiconductor die that exist outside of maverick control limits 402 and 404 are deemed to be affected by a process excursion that causes the semiconductor die to function differently than the main population of semiconductor die. Disposition of the abnormal die may then be determined based upon the criticality of the data value being analyzed, the root cause of the data value's excursion from a normal population of data values, and/or the probable risk of other non-detectable failures occurring.

As discussed above, maverick control limits may also be calculated in 2-dimensions, which is advantageous when it is found that two critical parameters are found to be highly correlated, i.e., that they have a strong relationship to one another. Thus, correlation analysis block 124 of FIG. 1 may also be utilized to determine whether two critical parameters have a large coefficient of correlation.

For example, semiconductor devices designed for high-speed applications often require an increased amount of power supply current to operate. Thus, correlation analysis block 124 of FIG. 1 may determine that the rise and fall times of data transitions (critical data value X) within a semiconductor device are highly correlated to the amount of power supply current (critical data value Y) that is consumed by those semiconductor devices. Density identification block 126 may then be employed to determine the probability density function that correctly describes the behavior of the critical data values, X and Y, across the entire population.

Figure 5:
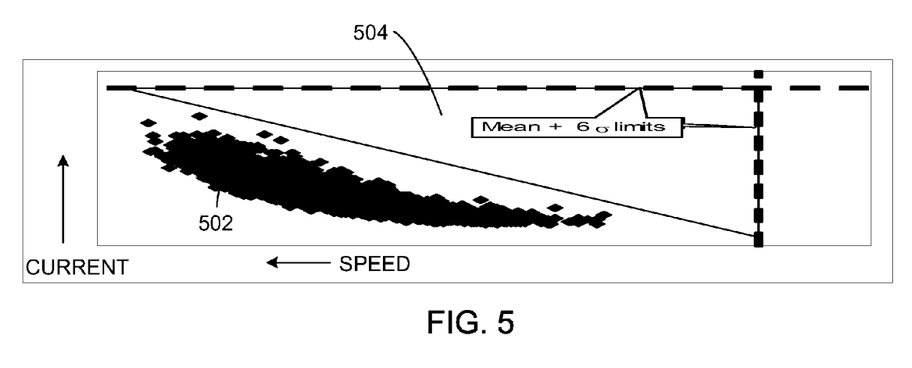
FIG. 5 exemplifies 2-dimensional correlation information that may exist between two sets of parametric data.

Turning to FIG. 5, for example, typical speed vs. power supply current measurements taken across a large population of semiconductor die is exemplified. As can be verified from area 502 of the graph of FIG. 5, the rise and fall times of data transitions (critical data value X) plotted against the corresponding amount of power supply current (critical data value Y) is not a linear curve and in many instances, is rather defined by a $2^{nd}$ or $3^{rd}$ order polynomial. As may be further verified, area 504 represents a significant area where abnormal, or atypical, data measurements may reside. Thus, the object of the 2-dimensional maverick control limit method is to identify a normal correlation curve that defines an acceptable bivariate fit between two highly correlated data sets. Data sets measured from semiconductor die may then be compared to the normal correlation curve to determine pass/fail status of the semiconductor die.

Once correlation analysis block 124 determines the critical data values X, e.g., rise and fall times of data transitions, and the corresponding critical data values Y, e.g., the amount of power supply current drain, then proper segments across the horizontal axis of the graph of FIG. 5 are to be ascertained. As can be seen from FIG. 5, for example, variability of current measurements does not remain constant, but increases with increasing speed.

Thus, separate maverick control limits should be found for each segment across the horizontal axis, where the number of X-axis segments should be equal to about 10-20 segments so that a valid correlation curve may be found. Furthermore, each X-axis segment should be substantially equal in size and all X-axis segments should cover the entire range of the measured data set.

It can be seen that for each X-axis data segment generated, a corresponding number of Y-data measurements exist. Thus, the Y-axis data values in each X-axis data segment exhibit a probability density function that may be identified by density identification block 126 as discussed above in relation to FIG. 2B. As discussed above in relation to FIGS. 3A-3B, outlier elimination block 128 then implements an iterative outlier elimination method using 4-sigma limits. If the probability density function for each X-axis data segment exhibits a normal density function, then mean+/−4-sigma limits may be imposed.

If, on the other hand, as illustrated in FIG. 3A, each X-axis data segment exhibits a lognormal density function, then 4-sigma limits are initially placed on the data set such that the lower percentile is set to 0.000032 and the upper percentile is set to 0.999968. Next, the outliers in the data set that exist beyond the lower and upper percentiles are removed by outlier elimination block 128 and quantiles are then recalculated on the resulting data set. Outliers are once again removed from the resulting data set and quantiles recalculated. The method is iterated until a convergence is obtained as exemplified in FIG. 3B, whereby all outliers are removed from areas 356 and 354. Once the probability density functions for each X-axis data segment have been identified and the outliers from each X-axis data segment have been removed, then maverick control limits may be calculated for each X-axis data segment as discussed above in relation to FIG. 4.

Figure 6:
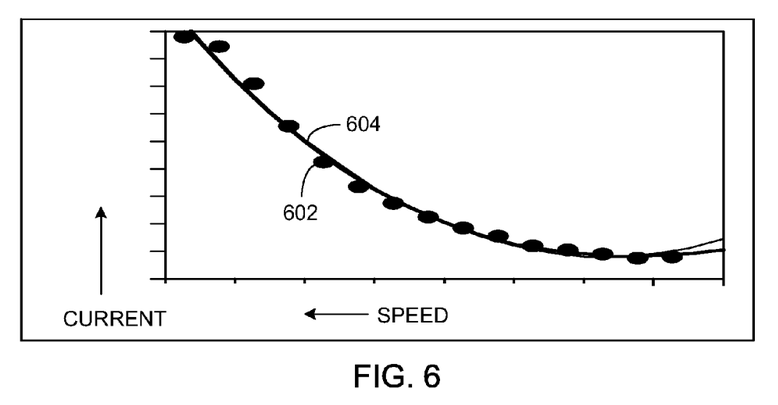
FIG. 6 exemplifies maverick control limits established for the 2-dimensional parametric data set of FIG. 5.

Turning to FIG. 6, a correlation graph is exemplified, whereby each X-axis data segment 602 is plotted after maverick control limits are imposed. Next, equation fitting block 132 is utilized to find the best equation that describes the data plotted in FIG. 6. As can be seen, the equation describing function 604 is non-linear and generally may be described as an $n^{th}$ order polynomial having degree 2 or 3. Data sets measured from semiconductor die may then be compared to correlation curve 604 to determine pass/fail status of the semiconductor die.

Figure 7:
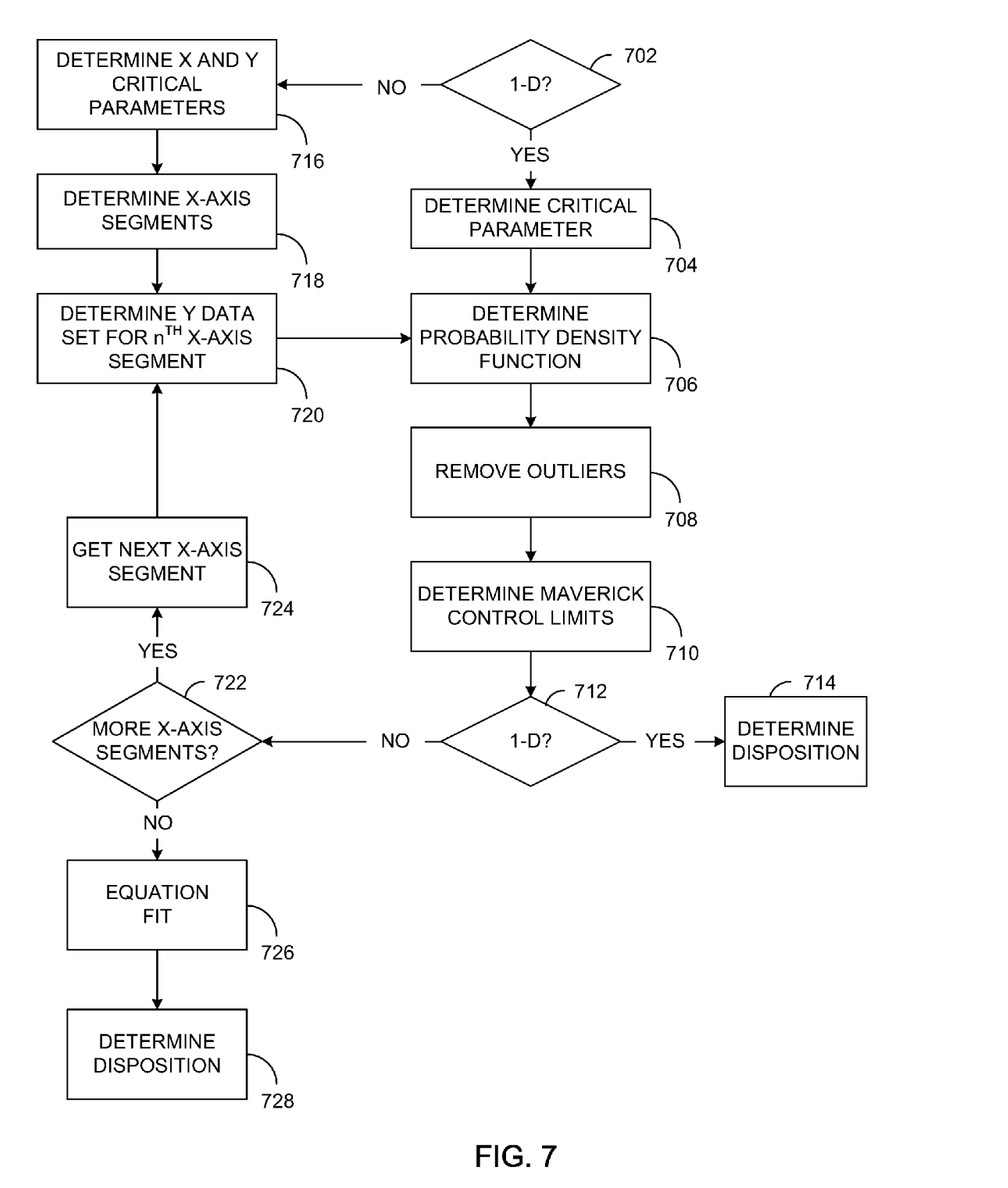
FIG. 7 illustrates a flow diagram of a 1-dimensional or a 2-dimensional maverick control limit method in accordance with one embodiment of the present invention.

Turning to FIG. 7, an exemplary flow diagram is illustrated describing exemplary steps that may be executed by maverick control platform 138 for the calculation of either 1-dimensional or 2-dimensional maverick control limits, as determined in step 702. If 1-dimensional maverick control limits are to be determined, then in step 704, the critical parameter is selected by correlation analysis block 124 as discussed above in relation to maverick control platform 138 of FIG. 1. Parametric data corresponding to the critical parameter selected in step 704 may then be downloaded into density identification block 126 from, for example, disk drive 112 of maverick control platform 138.

In step 706, density identification block 126 determines the probability density function that is exhibited by the parametric data set corresponding to the critical parameter selected in step 704 as discussed above in relation to FIG. 2B. In step 708, outliers are iteratively removed from the parametric data set by outlier elimination block 128 as discussed above in relation to FIGS. 3A-3B. Maverick control limits may then be calculated for the parametric data set by maverick control limit block 130 as in step 710 as discussed above in relation to FIG. 4. If a 1-dimensional maverick control implementation is being implemented as determined in step 712, then the method completes and disposition of semiconductor die may commence as in step 714.

If 2-dimensional maverick control limits are to be determined, on the other hand, as determined in step 702, then critical X and Y data parameters are selected in step 716 as discussed above in relation to FIG. 5. X-axis segments are then determined in step 718 and the corresponding Y-data measurements for the first X-axis segment are then gathered in step 720. Steps 706-712 are then executed as discussed above for the 1-D maverick control limit calculations. If more X-axis segments exist, as determined in step 722, then the next X-axis segment is selected in step 724 and the corresponding Y-data measurements are gathered for that X-axis segment. Steps 706-712 and 720-724 are then iterated until all Y-data measurements for each X-axis segment have been processed. Step 726 is then executed by equation fitting block 132, so that an equation may be fitted to each X-axis segment processed as discussed above in relation to FIG. 6. Once the equation fitting step is complete, disposition of semiconductor die may commence, as in step 728, using correlation information gathered across two highly correlated parametric data sets.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of calculating maverick control limits, the method comprising:
   selecting at least one critical parameter;
   importing at least one parametric data set associated with the at least one critical parameter into a density identification block of a maverick control platform;
   identifying a probability density function exhibited by the at least one parametric data set;
   removing outlier data from the at least one parametric data set;
   determining, using a processor, maverick control limits for the at least one parametric data set; and
   generating a disposition determination in response to the maverick control limits determined for the at least one parametric data set.

2. The method of claim 1, wherein selecting the at least one critical parameter comprises identifying high risk parameters.

3. The method of claim 2, wherein identifying high risk parameters comprises prioritizing the high risk parameters in order of risk priority.

4. The method of claim 3, wherein identifying high risk parameters further comprises reducing the number of high risk parameters by removing redundant high risk parameters.

5. The method of claim 1, wherein removing outlier data from the at least one parametric data set comprises placing standard deviation limits on the at least one parametric data set.

6. The method of claim 5, wherein placing standard deviation limits on the at least one parametric data set comprises establishing upper and lower percentile limits.

7. The method of claim 6, wherein removing outlier data from the at least one parametric data set further comprises iteratively reducing the at least one parametric data set until a convergence is reached.

8. The method of claim 7, wherein each reduction iteration comprises:
   removing data from the at least one parametric data set that exists beyond the upper and lower percentile limits to generate at least one reduced parametric data set; and
   re-calculating quantiles on the at least one reduced parametric data set.

9. A maverick control limit processing system, comprising:
   a processor adapted to generate maverick control limits for one or more parametric data sets, the processor being further adapted to perform functions including,
   selecting one or more critical parameters;
   importing one or more parametric data sets associated with the one or more critical parameters into a density identification block of the maverick control limit processing system;
   identifying a probability density function exhibited by the one or more parametric data sets;
   removing outlier data from the one or more parametric data sets;
   determining maverick control limits for the one or more parametric data sets; and
   generating a disposition determination in response to the maverick control limits determined for the one or more parametric data sets.

10. The maverick control limit processing system of claim 9, wherein selecting one or more critical parameters comprises identifying high risk parameters.

11. The maverick control limit processing system of claim 10, wherein identifying high risk parameters comprises prioritizing the high risk parameters in order of risk priority.

12. The maverick control limit processing system of claim 11, wherein identifying high risk parameters further comprises reducing the number of high risk parameters by removing redundant high risk parameters.

13. The maverick control limit processing system of claim 9, wherein removing outlier data from the one or more parametric data sets comprises placing standard deviation limits on the one or more parametric data sets.

14. The maverick control limit processing system of claim 13, wherein placing standard deviation limits on the one or more parametric data sets comprises establishing upper and lower percentile limits.

15. The maverick control limit processing system of claim 14, wherein removing outlier data from the one or more parametric data sets further comprises iteratively reducing the one or more parametric data sets until a convergence is reached.

16. The maverick control limit processing system of claim 15, wherein each reduction iteration comprises:
  removing data from the one or more parametric data sets that exists beyond the upper and lower percentile limits to generate one or more reduced parametric data sets; and
  re-calculating quantiles on the one or more reduced parametric data sets.

17. A method of calculating maverick control limits, the method comprising:
  selecting two critical parameters;
  importing two parametric data sets associated with the two critical parameters into a density identification block of a maverick control platform;
  partitioning one of the parametric data sets into a plurality of data segments;
  identifying a data set for each of the plurality of data segments;
  identifying a probability density function exhibited by each identified data set;
  removing outlier data from each identified data set;
  determining, using a processor, maverick control limits for each identified data set;
  fitting an equation that corresponds to each identified data set of the plurality of data segments; and
  generating a disposition determination in response to the fitted equation.

18. The method of claim 17, wherein removing outlier data from each identified data set comprises placing standard deviation limits on each identified data set.

19. The method of claim 18, wherein placing standard deviation limits on each identified data set comprises establishing upper and lower percentile limits.

20. The method of claim 19, wherein removing outlier data from each identified data set further comprises iteratively reducing each identified data set until a convergence is reached, each reduction iteration including,
  removing data from each identified data set that exists beyond the upper and lower percentile limits to generate a reduced data set; and
  re-calculating quantiles on the reduced data set.

* * * * *